(12) United States Patent
Jeong et al.

(10) Patent No.: US 12,324,341 B2
(45) Date of Patent: Jun. 3, 2025

(54) TRANSPARENT DISPLAY DEVICE FOR REDUCING DIFFERENCE IN VISIBILITY BETWEEN DISPLAY AREA AND BEZEL AREA

(71) Applicant: LG DISPLAY CO., LTD., Seoul (KR)

(72) Inventors: Da-Woon Jeong, Paju-si (KR); Su-Yeon Lee, Paju-si (KR); Sung-Hee Kim, Paju-si (KR); Jae-Bin Song, Paju-si (KR); Sung-Hee Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/436,068

(22) Filed: Feb. 8, 2024

(65) Prior Publication Data

US 2024/0179993 A1    May 30, 2024

Related U.S. Application Data

(63) Continuation of application No. 17/338,444, filed on Jun. 3, 2021, now Pat. No. 11,963,423.

(30) Foreign Application Priority Data

Jun. 26, 2020  (KR) ........................ 10-2020-0078343

(51) Int. Cl.
*H10K 59/38* (2023.01)
*H10K 59/121* (2023.01)

(52) U.S. Cl.
CPC ........... *H10K 59/38* (2023.02); *H10K 59/121* (2023.02)

(58) Field of Classification Search
CPC .. H10K 59/38; H10K 59/121; H10K 50/8426; H10K 59/1213; H10K 59/123; H10K 59/122; H10K 59/131
See application file for complete search history.

(56) References Cited

U.S. PATENT DOCUMENTS

| 2014/0098310 A1 | 4/2014 | Lee et al. | |
| 2015/0357535 A1* | 12/2015 | Shimonishi | H01L 25/0753 257/89 |

(Continued)

FOREIGN PATENT DOCUMENTS

| KR | 10-2000-0057974 A | 9/2000 |
| KR | 10-2016-0028558 A | 3/2016 |

(Continued)

OTHER PUBLICATIONS

Choi et al. KR 10-2020-0025920, Mar. 2020, machine translation (Year: 2020).*

(Continued)

*Primary Examiner* — Tracie Y Green
(74) *Attorney, Agent, or Firm* — Fish & Richardson P.C.

(57) ABSTRACT

A transparent display device comprises: a first substrate including a display area and first to fourth bezel areas surrounding the display area, wherein the display area includes a plurality of pixel regions each including an emitting portion and a transparent portion; a second substrate facing the first substrate; a transparent dam between the first and second substrates and in the first to fourth bezel areas; a first pad electrode on the first substrate and in the first bezel area; and a first color filter pattern on the second substrate and in the first bezel area.

21 Claims, 8 Drawing Sheets

(56) References Cited

U.S. PATENT DOCUMENTS

| | | | |
|---|---|---|---|
| 2017/0168342 A1 | 6/2017 | Park et al. | |
| 2020/0073169 A1* | 3/2020 | Jung | G02F 1/133617 |
| 2021/0126056 A1 | 4/2021 | Kim et al. | |
| 2021/0335913 A1 | 10/2021 | Zhang et al. | |
| 2022/0278173 A1* | 9/2022 | Kong | H10K 59/351 |
| 2023/0157085 A1* | 5/2023 | Kim | G09G 3/006 |
| | | | 345/204 |

FOREIGN PATENT DOCUMENTS

| | | |
|---|---|---|
| KR | 10-2016-0046072 A | 4/2016 |
| KR | 10-2018-0079078 A | 7/2018 |
| KR | 10-2018-0130447 A | 12/2018 |
| KR | 10-2033615 B1 | 10/2019 |
| KR | 20200025920 A * | 3/2020 |
| KR | 10-2020-0057198 A | 5/2020 |
| KR | 10-2020-0061475 A | 6/2020 |

OTHER PUBLICATIONS

Korean Office Action dated Feb. 27, 2024 issued in Patent Application No. 10-2020-0078343 (8 pages).
Lee, KR102033615B1 machine translation Oct. 2019 (Year: 2019).

* cited by examiner

TRANSPARENT DISPLAY DEVICE FOR REDUCING DIFFERENCE IN VISIBILITY BETWEEN DISPLAY AREA AND BEZEL AREA

CROSS-REFERENCE TO RELATED APPLICATIONS

This application is a continuation of U.S. patent application Ser. No. 17/338,444, filed on Jun. 3, 2021, which claims the priority of Korean Patent Application No. 10-2020-0078343 filed on Jun. 26, 2020, which are hereby incorporated by reference in their entirety.

BACKGROUND

Field of the Disclosure

The present disclosure relates to a transparent display device, and more particularly, to a transparent display device being capable of minimizing a difference in visibility between a display area and a bezel area.

Description of the Background

As a result of the growth of information technology and mobile communication technology, devices capable of displaying a visual image have been developed. Examples include flat panel display devices, such as liquid crystal display (LCD) devices, plasma display panel (PDP) devices, field emission display (FED) devices, and electroluminescent (EL) display devices.

Recently, a transparent display device capable of displaying an image without interfering with the view by transmitting light from the front and rear sides has been developed.

For example, in a transparent EL display device, a light emitting diode is formed in a portion of the display area to serve as an emitting portion, and the light is transmitted in other areas to serve as a transparent portion.

However, in the related art transparent display device, there is a problem of a big difference in visibility between a display area and a bezel area surrounding the display area.

SUMMARY

The present disclosure is directed to a transparent display device that substantially obviates one or more of the problems associated with the limitations and disadvantages of the related conventional art.

Additional features and advantages of the present disclosure are set forth in the description which follows, and will be apparent from the description, or evident by practice of the present disclosure. Other advantages of the present disclosure are realized and attained by the features described herein as well as in the appended drawings.

To achieve these and other advantages in accordance with the purpose of the aspects of the present disclosure, as described herein, an aspect of the present disclosure is a transparent display device comprising: a first substrate including a display area and first to fourth bezel areas surrounding the display area, wherein the display area includes a plurality of pixel regions each including an emitting portion and a transparent portion; a second substrate facing the first substrate; a transparent dam between the first and second substrates and in the first to fourth bezel areas; a first pad electrode on the first substrate and in the first bezel area; and a first color filter pattern on the second substrate and in the first bezel area.

Another aspect of the present disclosure is a transparent display device comprising: first and second transparent display panels arranged along a first direction, each of the first and second transparent display panels including: a first substrate including a first display area and first to fourth bezel areas surrounding the first display area, wherein the first display area includes a plurality of first pixel regions each including a first emitting portion and a second transparent portion; a second substrate facing the first substrate; a first transparent dam between the first and second substrates and in the first to fourth bezel areas; a first pad electrode on the first substrate and in the first bezel area; and a first color filter pattern on the second substrate and in the first bezel area; and third and fourth transparent display panels disposed at a second direction being perpendicular to the first direction with respect to the first and second transparent display panels and arranged along the first direction, each of the third and fourth transparent display panels including: a third substrate including a second display area and fifth to eighth bezel areas surrounding the second display area, wherein the second display area includes a second plurality of pixel regions each including a second emitting portion and a second transparent portion; a fourth substrate facing the third substrate; a second transparent dam between the third and fourth substrates and in the fifth to eighth bezel areas; a second pad electrode on the third substrate and in the fifth bezel area; and a second color filter pattern on the fourth substrate and in the fifth bezel area, wherein the first bezel area of the first and second transparent display panels is disposed at an opposite side to the fifth bezel area of the third and fourth transparent display panels.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of the present disclosure, illustrate aspects of the present disclosure and together with the description serve to explain the principles of the present disclosure.

DETAILED DESCRIPTION

As described above, in a transparent display device, there is a problem of a difference in visibility between a display area and a bezel area surrounding the display area. The problem will be explained with reference to FIG. 1.

Figure 1:
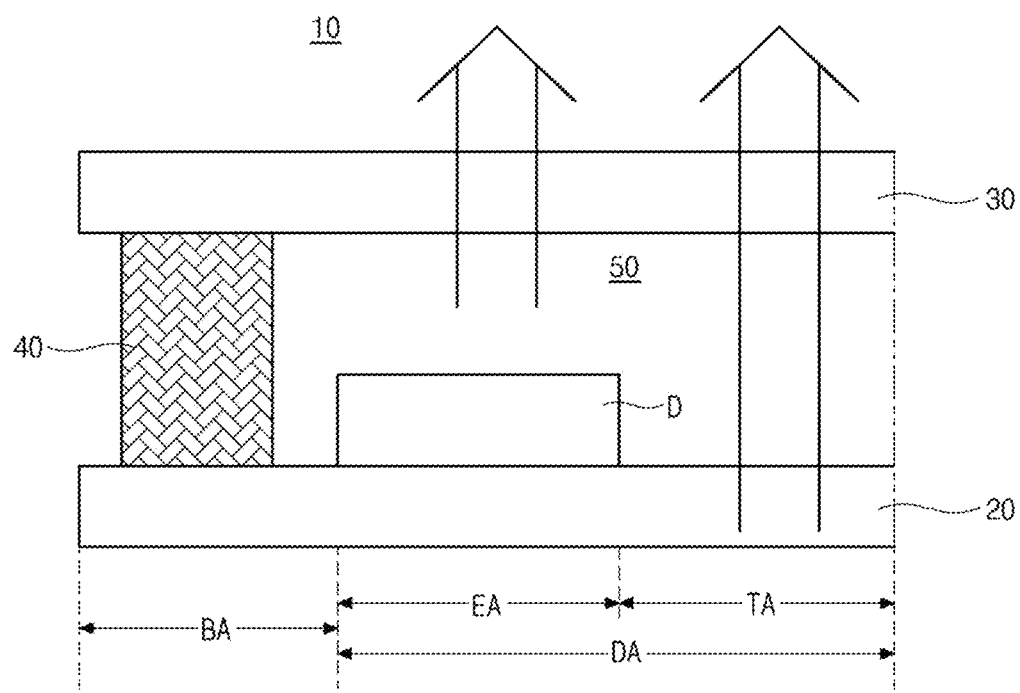
FIG. 1 is a schematic view illustrating a difference of visibility between a display area and a bezel area in a transparent display device.

As shown in FIG. 1, a display area DA and a bezel area BA at a periphery of the display area DA are defined in a transparent display device 10, and an emitting portion EA and a transparent portion TA are defined in the display area DA. The transparent display device 10 includes first and second substrates 20 and 30, which faces each other, a light emitting diode D, which is disposed in the emitting portion EA and on or over the first substrate 20, a dam 40, which is disposed in the bezel area BA and provides an inner space with the first and second substrates 20 and 30, and a filler layer 50, which is disposed in the inner space provided by the first substrate 20, the second substrate 30 and the dam 40 and attaches the first and second substrates 20 and 30.

In the transparent display device 10, an image is displayed by the light emitting diode D in the emitting portion EA, and the light from the rear side of the first substrate 20 is transmitted through the transparent portion TA.

The dam 40 is opaque. The dam 40 includes a getter such as CaO such that the dam 40 has high haze value in the condition of high humidity.

Accordingly, in the transparent display device, there is a problem of a difference in visibility between the display area and the bezel area.

Reference will now be made in detail to some of the examples and aspects, which are illustrated in the accompanying drawings.

Figure 2:
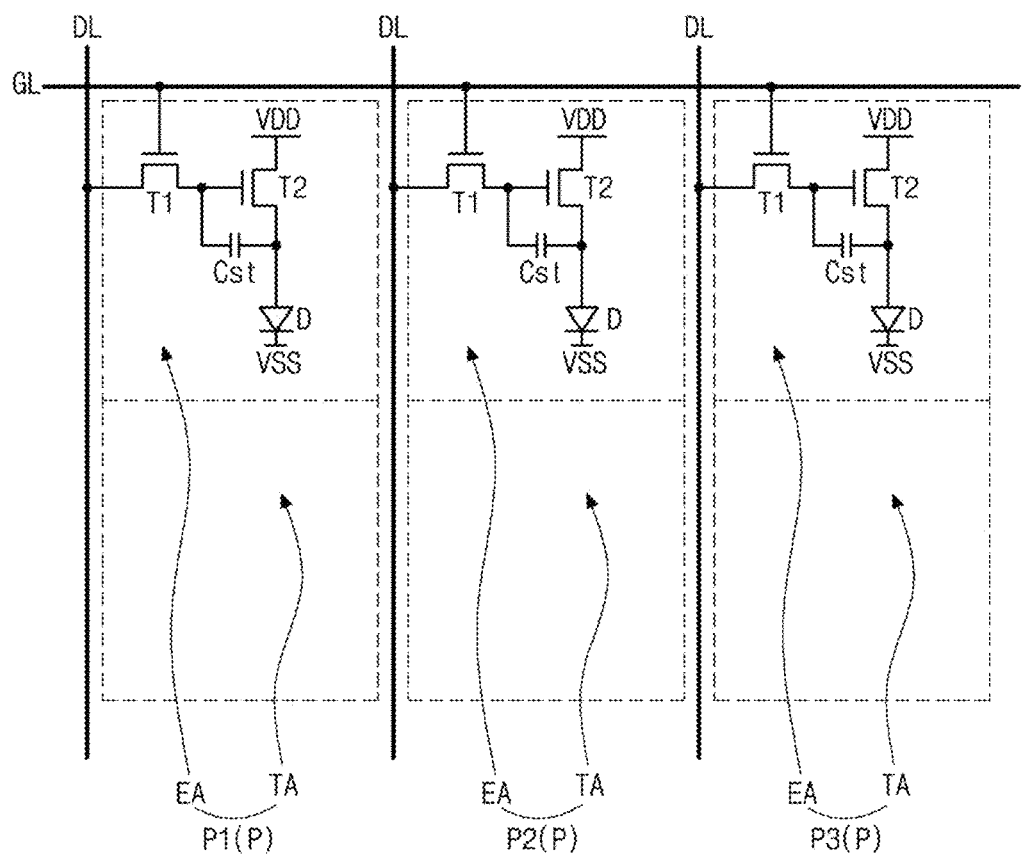
FIG. 2 is a schematic circuit diagram of a transparent display device of the present disclosure.

FIG. 2 is a schematic circuit diagram of a transparent display device of the present disclosure.

As shown in FIG. 2, a transparent display device of the present disclosure includes a plurality of pixel regions P, and each pixel region P includes an emitting portion EA and a transparent portion TA.

In more detail, the transparent display device includes a gate line GL and a data line DL crossing each other to define a first pixel region P1, a second pixel region P2 and a third pixel region P3, and each of the first to third pixel regions P1 to P3 includes the emitting portion EA and the transparent portion TA. The first to third pixel regions P1 to P3 constitute a unit pixel, and one unit pixel includes three emitting portions EA and three transparent portions TA.

Alternatively, the transparent portions TA of the first to third pixel regions P1 to P3 may be continuous or connected to each other to be provided as one-body. Namely, one unit pixel may include three emitting portions EA and one transparent portion TA.

In the emitting portion EA of each of the first to third pixel regions P1 to P3, a first thin film transistor (TFT) T1, a second TFT T2, a storage capacitor Cst and a light emitting diode D are disposed. Namely, the transparent display device of the present disclosure may be a transparent EL display device.

The gate line GL extends in a first direction, e.g., a horizontal direction, and the data line DL extends in a second direction, e.g., a vertical direction. The first, second and third pixel regions P1, P2 and P3 are sequentially arranged along the first direction. For example, the first to third pixel regions P1 to P3 may be a red pixel region, a green pixel region and a blue pixel region, respectively.

In the first TFT T1, a gate electrode is connected to the gate line GL, and a source electrode is connected to the data line DL. In the second TFT T2, a gate electrode is connected to a drain electrode of the first TFT T1, and a source electrode is connected to a high voltage supply VDD. An anode of the light emitting diode D is connected to a drain electrode of the second TFT T2, and a cathode of the light emitting diode D is connected to a low voltage supply VSS. The storage capacitor Cst is connected to the gate electrode and the drain electrode of the second TFT T2. Namely, the first TFT T1 may be a switching element, and the second TFT T2 may be a driving element.

In the transparent display device, when the first TFT T1 is turned on by a gate signal applied through the gate line GL, a data signal from the data line DL is applied to the gate electrode of the second TFT T2 and an electrode of the storage capacitor Cst.

When the second TFT T2 is turned on by the data signal, an electric current is supplied to the light emitting diode D from the high voltage supply VDD. As a result, the light emitting diode D emits light.

The storage capacitor Cst serves to maintain the voltage of the gate electrode of the second TFT T2 when the first TFT T1 is turned off. Accordingly, even if the first TFT T1 is turned off, a level of an electric current applied from the high voltage supply VDD to the light emitting diode D is maintained to next frame.

As a result, the transparent display device displays a desired image.

Figure 3:
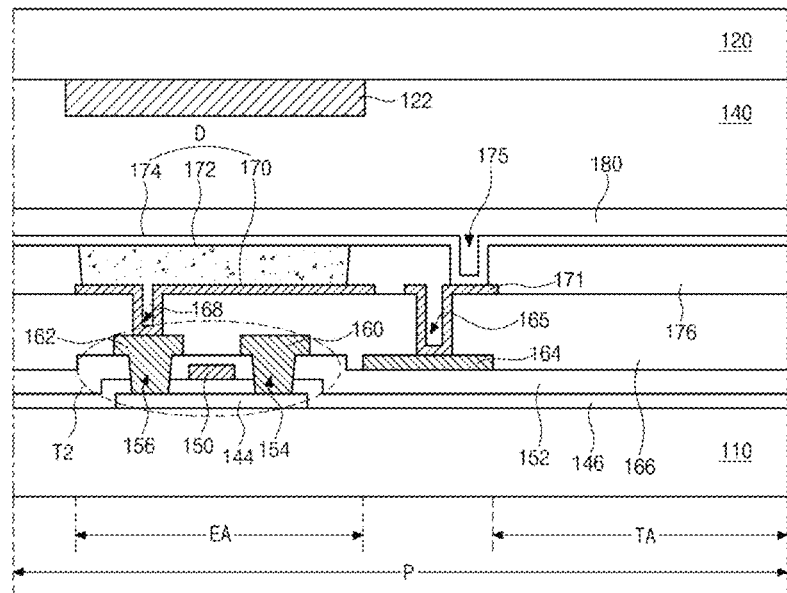
FIG. 3 is a schematic cross-sectional view of a pixel region of a transparent display device of the present disclosure.

FIG. 3 is a schematic cross-sectional view of a pixel region of a transparent display device of the present disclosure.

As shown in FIG. 3, a transparent display device includes a first substrate 110, a second substrate 120 facing the first substrate 110, a light emitting diode D between the first and second substrates 110 and 120, and a color filter layer 122, which corresponds to the light emitting diode D and is positioned between the light emitting diode D and the second substrate 120. In addition, the transparent display device may further include a filler layer 140, which fills a space between the first and second substrates 110 and 120 and attaches the first and second substrates 110 and 120, and an encapsulation layer 180 covering or encapsulating the light emitting diode D to prevent moisture and/or oxygen to the light emitting diode D.

Each of the first and second substrates 110 and 120 may be a glass substrate or a plastic substrate. For example, each of the first and second substrates 110 and 120 may be a transparent polyimide substrate.

A semiconductor layer 144 is formed on the first substrate 110. The semiconductor layer 144 may include an oxide semiconductor material or polycrystalline silicon. Although not shown, a buffer layer, which includes an inorganic insulating material, e.g., silicon oxide or silicon nitride, may be formed between the first substrate 110 and the second TFT T2.

When the semiconductor layer 144 includes the oxide semiconductor material, a light-shielding pattern (not shown) may be formed under the semiconductor layer 144. The light to the semiconductor layer 144 may be shielded or blocked by the light-shielding pattern such that thermal degradation of the semiconductor layer 144 may be prevented. When the semiconductor layer 144 includes polycrystalline silicon, impurities may be doped into both sides of the semiconductor layer 144.

A gate insulating layer 146 is formed over an entire surface of the substrate 101 including the semiconductor layer 144. The gate insulating layer 146 may be formed of an inorganic insulating material such as silicon oxide or silicon nitride.

A gate electrode 150, which is formed of a conductive material, e.g., a metal, is formed on the gate insulating layer 146 above a center of the semiconductor layer 144. For example, the gate electrode 150 may include copper, aluminum, molybdenum, titanium and their alloy and may have a single-layered structure or a multi-layered structure.

In FIG. 3, the gate insulating layer 146 is formed on the entire surface of the first substrate 110. Alternatively, the gate insulating layer 146 may be patterned to have the same shape or a similar shape as the gate electrode 150.

An interlayer insulating layer 152, which is formed of an insulating material, is formed on an entire surface of the first substrate 110 including the gate electrode 160. The interlayer insulating layer 152 may be formed of an inorganic insulating material, e.g., silicon oxide or silicon nitride, or an organic insulating material, e.g., benzocyclobutene or photo-acryl.

The interlayer insulating layer 152 includes first and second contact holes 154 and 156 exposing both sides of the semiconductor layer 144. The first and second contact holes 154 and 156 are positioned at both sides of the gate electrode 150 to be spaced apart from the gate electrode 150.

In FIG. 3, the first and second contact holes 154 and 156 extend into the gate insulating layer 146. Alternatively, when the gate insulating layer 146 is patterned to have the same shape as the gate electrode 150, the first and second contact holes 154 and 156 are formed only through the interlayer insulating layer 152 and not through the gate insulating layer 146.

A source electrode 160, a drain electrode 162 and an auxiliary electrode 164, which are formed of a conductive material, e.g., a metal, are formed on the interlayer insulating layer 152. For example, each of the source electrode 160, the drain electrode 162 and the auxiliary electrode 164 may include copper, aluminum, molybdenum, titanium and their alloy and may have a single-layered structure or a multi-layered structure.

The source electrode 160 and the drain electrode 162 are spaced apart from each other with respect to the gate electrode 150 and respectively contact both sides of the semiconductor layer 144 through the first and second contact holes 154 and 156. The auxiliary electrode 164 is positioned to be spaced apart from the source and drain electrodes 160 and 162.

The semiconductor layer 144, the gate electrode 150, the source electrode 160 and the drain electrode 162 constitute the second TFT T2 serving as a driving element (driving TFT). The second TFT T2 is positioned in the emitting portion EA of the pixel region P.

In the second TFT T2, the gate electrode 150, the source electrode 160 and the drain electrode 162 are positioned over the semiconductor layer 144. Namely, the second TFT T2 has a coplanar structure.

Alternatively, in the second TFT T2, the gate electrode may be positioned under the semiconductor layer, and the source and drain electrodes may be positioned over the semiconductor layer such that the second TFT T2 may have an inverted staggered structure. In this instance, the semiconductor layer may include amorphous silicon.

Although not shown, the gate and data lines crossing each other to define the pixel region P and the first TFT T1 as the switching element are further formed. The first TFT T1 is connected to the second TFT T2.

A passivation layer 166, which includes a drain contact hole 168 exposing the drain electrode 162 of the second TFT T2 and a first auxiliary contact hole 165 exposing the auxiliary electrode 164, is formed to cover the second TFT T2 and the auxiliary electrode 164.

A first electrode 170, which is connected to the drain electrode 162 of the second TFT T2 through the drain contact hole 168, is separately formed in each pixel region P. The first electrode 170 is positioned in the emitting portion EA of the pixel region P. For example, the first electrode 170 may be an anode and may be formed of a conductive material having a relatively high work function. For example, the first electrode 170 may be formed of a transparent conductive material such as indium-tin-oxide (ITO) and indium-zinc-oxide (IZO).

When the transparent display device of the present disclosure is operated in a top-emission type, a reflection electrode or a reflection layer may be formed under the first electrode 170 to improve the optical efficiency. The reflection electrode or the reflection layer may be formed of aluminum-palladium-copper (APC) alloy or silver (Ag). For example, the first electrode 170 may have a triple-layered structure of ITO/APC/ITO or a triple-layered structure of ITO/Ag/ITO.

In addition, a connection pattern 171, which is connected to the auxiliary electrode 164 through the first auxiliary contact hole 165, is formed on the passivation layer 166. The connection pattern 171 may be formed of the same material as the first electrode 170. For example, the connection pattern 171 may have a triple-layered structure of ITO/APC/ITO or a triple-layered structure of ITO/Ag/ITO.

A bank 172 surrounding the pixel region P is formed on the passivation layer 166. The bank 172 covers edges of the first electrode 170. The bank 172 includes an opening exposing a center of the first electrode 170 and a second auxiliary contact hole 175 exposing the connection pattern 171.

An emitting layer 172 is formed on the first electrode 170. The emitting layer 172 may have a single-layered structure of an emitting material layer (EML) including an emitting material. For example, the emitting material may include an organic emitting material, e.g., a phosphorescent compound, a fluorescent compound or a delayed fluorescent compound, or an inorganic emitting material, e.g., a quantum dot.

The emitting layer 172 may have a multi-layered structure to improve an emission efficiency. For example, the emitting layer 172 may include a hole injection layer (HIL), a hole transporting layer (HTL), the EML, an electron transporting layer (ETL) and an electron injection layer (EIL).

For example, the emitting layer 172 may be separated in each of the first to third pixel regions P1 to P3 to emit the red, green and blue light, respectively. Alternatively, the emitting layer 172 may include at least two emitting parts to emit the white light.

A second electrode 174 is formed over the first substrate 110 including the emitting layer 172. The second electrode 174 may cover an entire surface of the display area. The second electrode 174 may be a cathode and may be formed of a conductive material having a relatively low work function. For example, the second electrode 174 may include aluminum (Al), magnesium (Mg), or Al—Mg alloy (AlMg). In the top-emission type transparent display device, the second electrode 174 may have a relatively small thickness to serve as a transparent electrode (or a semi-transparent electrode).

The second electrode 174 contacts the connection pattern 171 through the second auxiliary contact hole 175 and is electrically connected to the auxiliary electrode 164 through the connection pattern 171. Accordingly, a voltage drop problem of the second electrode 174 may be prevented.

In FIG. 3, the auxiliary electrode 164 is disposed at the same layer as the source and drain electrodes 160 and 162. Alternatively, the auxiliary electrode 164 may be disposed at the same layer as the gate electrode 150. In addition, an additional insulating layer may be formed between the source and drain electrodes 160 and 162 and the passivation layer 166, and the auxiliary electrode 164 may be disposed between the additional insulating layer and the passivation layer 166. The auxiliary electrode 164 and the connection pattern 171 may be omitted.

The first electrode 170, the emitting layer 172 and the second electrode 174 constitute the light emitting diode D.

The encapsulation layer 180 is formed on the second electrode 174. The encapsulation layer 180 may have a single-layered structure including an inorganic insulating material such as silicon oxide or silicon nitride. Alternatively, the encapsulation layer 180 may have a triple-layered structure of a first inorganic insulating layer, an organic insulating layer and a second inorganic insulating layer sequentially stacked. The encapsulation layer 180 may be omitted.

The color filter layer 122 corresponding to the light emitting diode D is formed on the second substrate 120. For example, the color filter layer 122 may include a red color filter pattern corresponding to one of the first to third pixel regions P1 to P3, a green color filter pattern corresponding to another one of the first to third pixel regions P1 to P3, and a blue color filter pattern corresponding to the other one of the first to third pixel regions P1 to P3.

The filler layer 140 is formed between the second substrate 120 and the encapsulation layer 180 to attach the first and second substrates 110 and 120. For example, the filler layer 140 may include or be formed of a transparent resin having a moisture-absorption property.

The light emitting diode D and the color filter layer 122 are disposed in the emitting portion EA of each pixel region P. On the other hand, the light emitting diode D and the color filter layer 122 are not presented in transparent portion TA. Accordingly, in the emitting portion EA, the light emitted from the light emitting diode D and passing through the color filter layer 122 is displayed, and in the transparent portion TA, the light from the rear side of the first substrate 110 is displayed.

Figure 4:
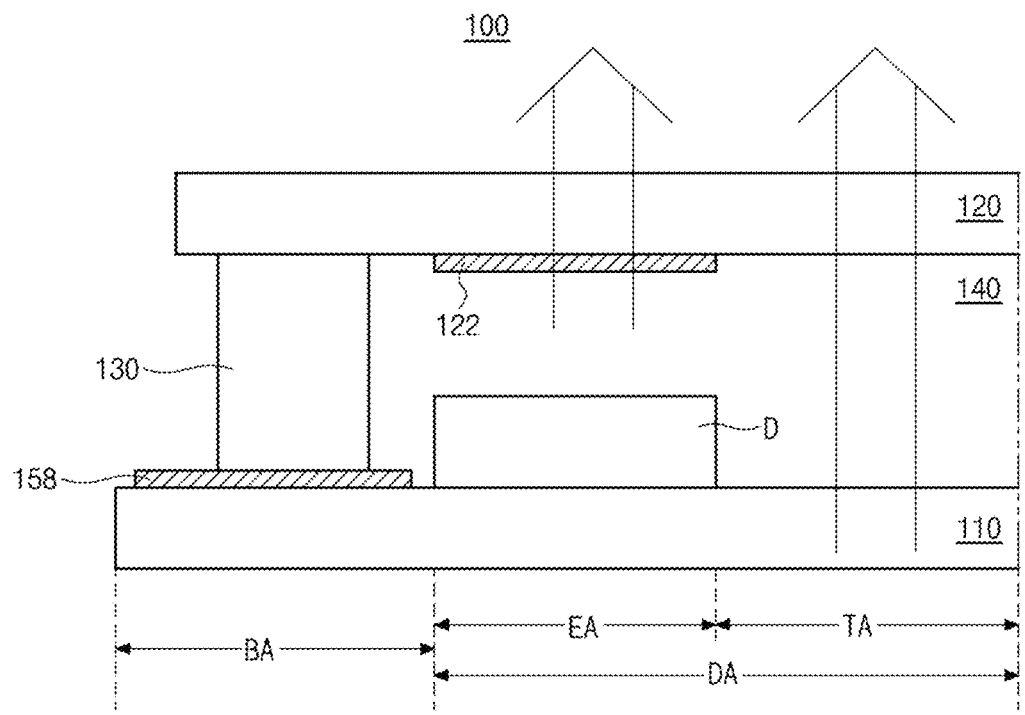
FIG. 4 is a schematic cross-sectional view of a transparent display device according to a first aspect of the present disclosure.

FIG. 4 is a schematic cross-sectional view of a transparent display device according to a first aspect of the present disclosure.

As shown in FIG. 4, in a transparent display device 100 according to the first aspect of the present disclosure, a display area DA and a bezel area BA at a periphery of the display area DA are defined. An emitting portion EA and a transparent portion TA are defined in the display area DA. The transparent display device 100 includes a first substrate 110, a second substrate 120 facing the first substrate 110, a light emitting diode D corresponding to the emitting portion EA and disposed on or over the first substrate 110, a pad electrode 158 corresponding to the bezel area BA and disposed on the first substrate 110, a transparent dam 130 disposed in the bezel area BA, a color filter layer 122, which corresponds to the light emitting diode D and is disposed on the second substrate 120, and a filler layer 140 disposed in the display area DA and attaching the first and second substrates 110 and 120.

As described with FIG. 3, the light emitting diode D may include the first electrode 170, the emitting layer 172 and the second electrode 174. In addition, the second TFT T2, which is connected to the light emitting diode D, as the driving element may be disposed between the first substrate 110 and the light emitting diode D.

The pad electrode 158 is disposed in the bezel area BA and between the first substrate 110 and the transparent dam 130. The signal from an external electronic component (not shown) is provided into the pixel region P through the pad electrode 158. Namely, the signal for driving the light emitting diode D is provided through the pad electrode 158.

The pad electrode 158 may be disposed at the same layer as the gate electrode 150 or the source electrode 160. The pad electrode 158 may include copper, aluminum, molybdenum, titanium and their alloy and may have a single-layered structure or a multi-layered structure.

In addition, the encapsulation layer 189 covering the light emitting diode D may extend to cover the pad electrode 158.

The light emitting diode D and the color filter layer 122 are disposed in the emitting portion EA and are not presented in the transparent portion TA.

The transparent dam 130 in the bezel area BA attaches an edge of the first and second substrates 110 and 120 and provides an inner space with the first and second substrates 110 and 120. The filler layer 140 fills the inner space provided by the first substrate 110, the second substrate 120 and the transparent dam 130 in the display area DA and attaches the first and second substrates 110 and 120.

The transparent dam 130 includes a polymer resin, a getter (moisture absorption material) and a spacer and has a light transmitting property. For example, with respect to the polymer resin, the getter may have a percentage by weight of about 1 to 10, and the spacer may have a percentage by weight of about 0.1 to 5. The percentage by weight of the getter may be greater than that of the spacer.

The polymer resin may be a photo-curable resin. For example, the polymer resin may be one of olefin resin, epoxy resin, urethane resin and their combination. The getter may be magnesium oxide (MgO) or zirconium oxide (ZrO). The spacer is included to maintain a gap between the first and second substrates 110 and 120. The spacer may be formed of polymethylmethacrylate (PMMA).

The transparent dam 130 may further include a filler for delaying or preventing penetration of moisture and/or oxygen, a monomer for controlling viscosity of the composition of the transparent dam 130, a photo-initiator, e.g., UV curing agent, and an additive, e.g., an adhesion promoter or a water-repelling agent. With respect to the polymer resin, each of the filler and the monomer may have a percentage by weight of about 5 to 20, and each of the photo-initiator and the additive may have a percentage by weight of about 0.1 to 5.

For example, the filler may be nano-silica, and the monomer may be acryl-based monomer. The photo-initiator may be a benzophenon-based compound, and the additive may be one of a fluorine-based compound, an alkoxy-based compound, a silane-based compound and a siloxane-based compound.

Figure 5A:
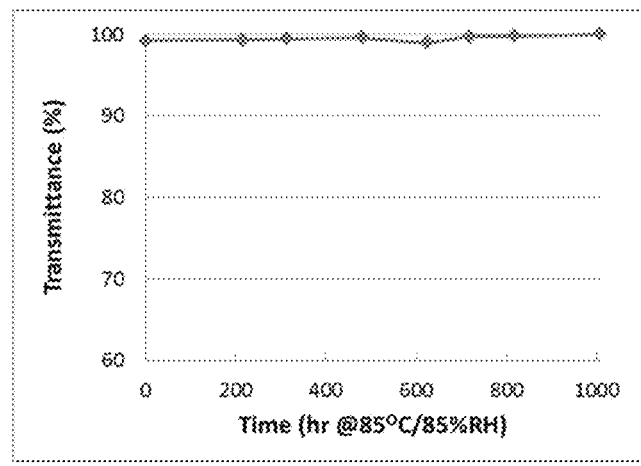
FIGS. 5A and 5B are graphs showing an optical property of a transparent dam.
Figure 5B:
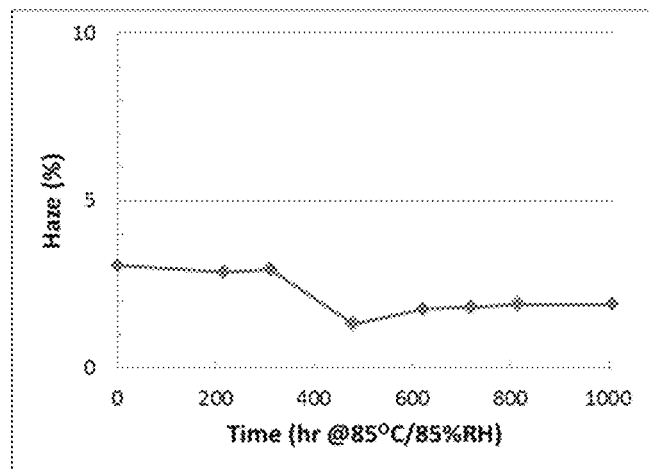

Referring to FIGS. 5A and 5B, which are graphs showing an optical property of the transparent dam, the transparent dam 130 has high light transmittance and a relatively low haze value under a condition of high humidity and high temperature.

Accordingly, the bezel area BA, where the transparent dam 130 is formed, has substantially the same performance (or function) as the transparent portion TA in the display area DA such that the difference in visibility between the display area DA and the bezel area BA caused by the opaque dam may be prevented.

However, the pad electrode 158 is formed in a portion of the bezel area BA. The ambient light (or external light) passing through the transparent dam 130 may be reflected by the pad electrode 158 such that the display quality may be degraded by the ambient light reflection.

For example, the pad electrode 158 is formed in one or two of the bezel regions surrounding four sides of the display area DA. Since the pad electrode 158 is formed of a metal having high reflection property, the above problem by the ambient light reflection is generated.

Figure 6:
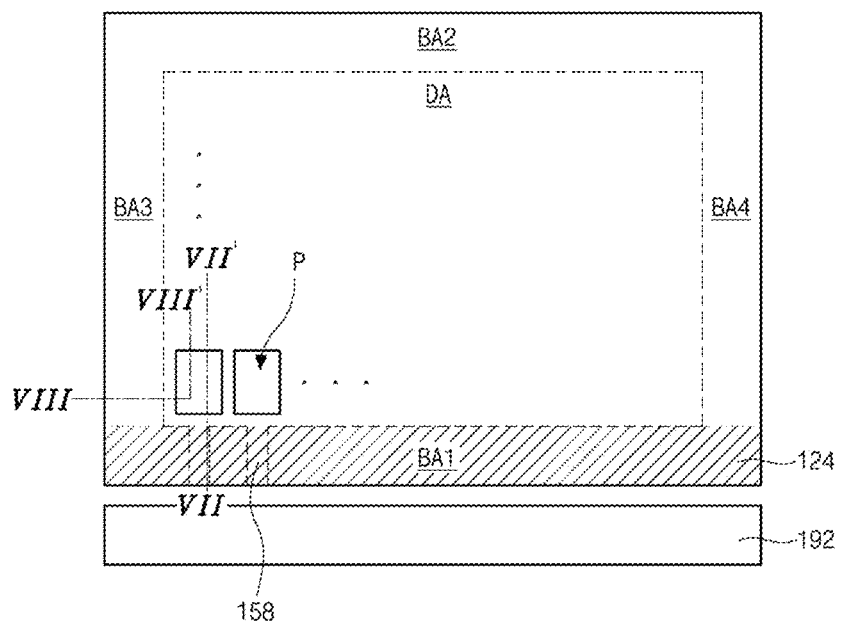
FIG. 6 is a schematic planar view of a transparent display device according to a second aspect of the present disclosure.

FIG. 6 is a schematic planar view of a transparent display device according to a second aspect of the present disclosure.

As shown in FIG. 6, a transparent display device 200 according to the second aspect of the present disclosure includes a display area DA including a plurality of pixel regions P, first to fourth bezel areas BA1, BA2, BA3 and BA4 surrounding the display area DA, a pad electrode 158, which is disposed in the first bezel area BA1 and electrically connected to the pixel region P, a transparent dam (not shown) in the first to fourth bezel areas BA1 to BA4, and a color filter pattern 124 in the first bezel area BA1.

The pad electrode 158 may be connected to an external driving part, e.g., a data driver IC 192.

In the transparent display device 200 according to the second aspect of the present disclosure, the transparent dam is disposed in all of the first to fourth bezel areas BA1 to BA4, while the color filter pattern 124 is disposed in the bezel area, where the pad electrode 158 is formed. The color filter pattern 124 corresponds to (or overlap) the pad electrode 158. Namely, the color filter pattern 124 is disposed in the first bezel area BA1 and is not presented in the second to fourth bezel areas BA2 to BA4. In the second to fourth bezel areas BA2 to BA4, the transparent dam without the color filter pattern 124 and the pad electrode 158 is presented.

Since the transparent dam having high light transmittance is disposed in the second to fourth bezel areas BA2 to BA4, the second to fourth bezel areas BA2 to BA4 have similar or substantially the same optical property as the transparent portion of the display area DA. On the other hand, since the color filter pattern 124 is disposed in the first bezel area BA1, the ambient light reflection by the pad electrode 158 in the first bezel area BA1 is decreased. In addition, since the light passing through the color filter pattern 124 is displayed in the first bezel area BA1, the difference in visibility between the display area DA and the bezel area BA is decreased.

Figure 7:
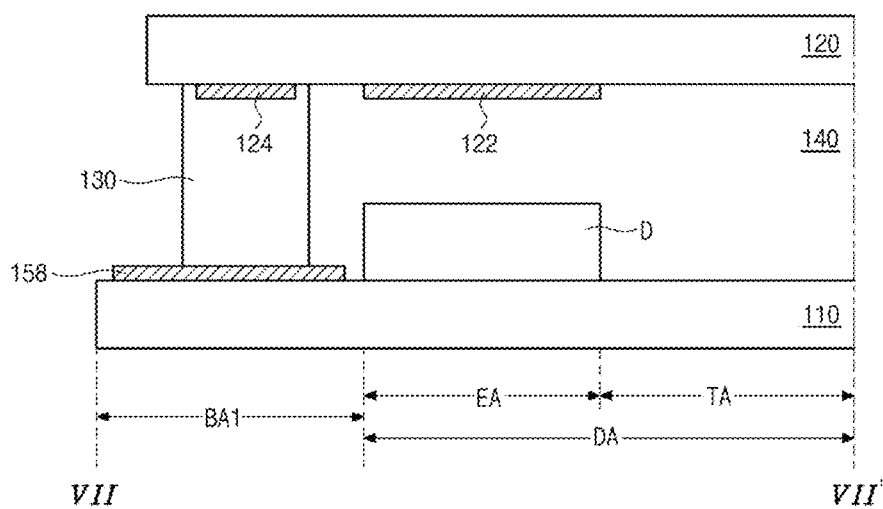
FIG. 7 is a cross-sectional view taken along line VII-VII' in FIG. 6.
Figure 8:
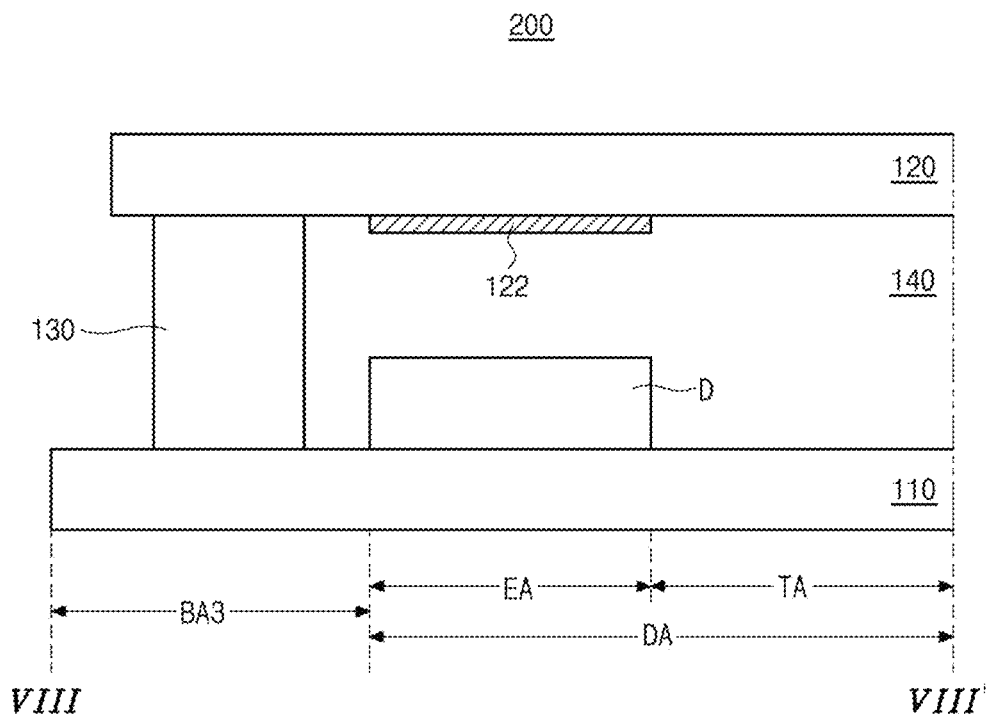
FIG. 8 is a cross-sectional view taken along line VIII-VIII' in FIG. 6.

FIG. 7 is a cross-sectional view taken along the line VII-VII' in FIG. 6, and FIG. 8 is a cross-sectional view taken along the line VIII-VIII' in FIG. 6.

Referring to FIGS. 7 and 8 with FIG. 6, in the transparent display device 200 according to the second aspect of the present disclosure, the display area DA, the first bezel area BA1 at a first side of the display area DA, the second bezel area BA2 at a second side of the display area DA being opposite to the first side of the display area DA, the third bezel area BA3 at a third side of the display area DA, and the fourth bezel area BA4 at a fourth side of the display area DA being opposite to the third side of the display area DA are defined. In addition, the emitting portion EA and the transparent portion TA are defined in the display area DA. The transparent display device 100 includes a first substrate 110, a second substrate 120 facing the first substrate 110, a light emitting diode D corresponding to the emitting portion EA and disposed on or over the first substrate 110, a pad electrode 158 corresponding to the first bezel area BA1 and disposed on the first substrate 110, a transparent dam 130 disposed in the first to fourth bezel areas BA1 to BA4, a color filter layer 122, which corresponds to the light emitting diode D and is disposed on the second substrate 120, a color filter pattern 124, which corresponds to the first bezel area BA1 and is disposed on the second substrate 120, and a filler layer 140 disposed in the display area DA and attaching the first and second substrates 110 and 120.

As described with FIG. 3, the light emitting diode D may include the first electrode 170, the emitting layer 172 and the second electrode 174. In addition, the second TFT T2, which is connected to the light emitting diode D, as the driving element may be disposed between the first substrate 110 and the light emitting diode D.

The pad electrode 158 is disposed in the bezel area BA and between the first substrate 110 and the transparent dam 130. The signal from an external electronic component (not shown) is provided into the pixel region P through the pad electrode 158. Namely, the signal for driving the light emitting diode D is provided through the pad electrode 158.

The pad electrode 158 may be disposed at the same layer as the gate electrode 150 or the source electrode 160. The pad electrode 158 may include copper, aluminum, molybdenum, titanium and their alloy and may have a single-layered structure or a multi-layered structure.

In addition, the encapsulation layer 189 covering the light emitting diode D may extend to cover the pad electrode 158.

The light emitting diode D and the color filter layer 122 are disposed in the emitting portion EA and are not presented in the transparent portion TA. For example, the filler layer 140 may have a first thickness in the emitting portion EA and a second thickness, which is greater than the first thickness, in the transparent portion TA.

The pad electrode 158 and the color filter pattern 124 are disposed or presented in the first bezel area BA1 and are not presented in the second to fourth bezel areas BA2 to BA4. For example, the color filter pattern 124 may be a color filter having the same color as the color filter layer 122 in a pixel region being adjacent to the first bezel area BA1, i.e., an outermost pixel region at a side of the first bezel area BA1. In other words, the color filter pattern 124 may be formed of the same material as the color filter layer 122 formed in the outermost pixel region at the side of the first bezel area BA1.

As described above, since the transparent dam having high light transmittance is disposed in the second to fourth bezel areas BA2 to BA4, the second to fourth bezel areas BA2 to BA4 have similar or substantially the same optical property as the transparent portion of the display area DA. On the other hand, since the color filter pattern 124 is disposed in the first bezel area BA1, the ambient light reflection by the pad electrode 158 in the first bezel area BA1 is decreased. In addition, since the light passing through the color filter pattern 124 is displayed in the first bezel area BA1, the difference in visibility between the display area DA and the bezel area BA is decreased. The color filter pattern 124 may have a single-layered structure such that an ambient light reflected by the pad electrode 158 or a light from a rear side of the first substrate 110 may pass through the color filter pattern 124.

Accordingly, the display quality of the transparent display device 200 according to the second aspect of the present disclosure is improved.

Figure 9:
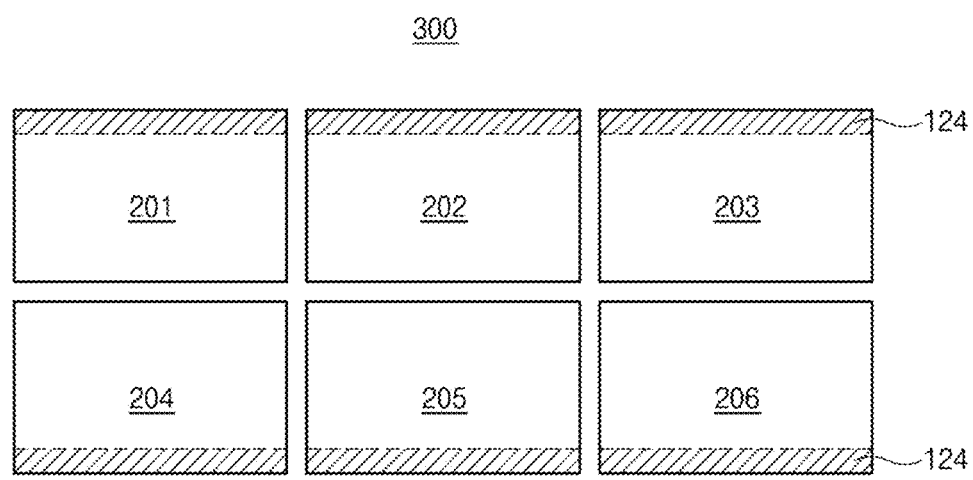
FIG. 9 is a schematic planar view of a transparent display device according to a third aspect of the present disclosure.

FIG. 9 is a schematic planar view of a transparent display device according to a third aspect of the present disclosure.

As shown in FIG. 9, a transparent display device 300 according to the third aspect of the present disclosure includes first to third transparent display panels 201, 202 and 203 arranged along a first direction and fourth to sixth transparent display panels 204, 205 and 206 arranged along the first direction and disposed at a second direction, which is perpendicular to the first direction, from the first to third transparent display panels 201 to 203. Namely, the first to sixth transparent display panels 201 to 206 are arranged in a 3*2 matrix shape.

Each of the first to sixth transparent display panels 201 to 206 may have a structure or configuration being substantially same as the transparent display device according to the second aspect of the present disclosure explained with FIGS. 6 to 8.

Namely, referring to FIGS. 6 to 8, each of the first to sixth transparent display panels 201 to 206 includes the display area DA and the first to fourth bezel areas BA1 to BA4 surrounding the display area DA. In the display area DA, a plurality of pixel regions P each including the emitting portion EA and the transparent portion TA are defined.

In the first bezel area BA1, the pad electrode 158, which is electrically connected to the pixel region P, is disposed on the first substrate 110, and the color filter pattern 124 is disposed on the second substrate 120. In addition, the transparent dam 130 is disposed between the first and second substrates 110 and 120. The transparent dam 130 is also disposed in the second to fourth bezel areas BA2 to BA4, while the pad electrode and the color filter pattern are not presented in the second to fourth bezel areas BA2 to BA4.

Referring to again FIG. 9, a first side of the first to third transparent display panels 201 to 203 is arranged to face the fourth to sixth transparent display panels 204 to 206, respectively, and the first bezel area BA1, where the pad electrode 158 (of FIG. 6) and the color filter pattern 124 are disposed, in the first to third transparent display panels 201 to 203 is disposed at a second side, which is opposite to the first side.

With respect to the first to third transparent display panels 201 to 203, the fourth to sixth transparent display panels 204 to 206 are disposed in the second direction being perpendicular to the first direction. A third side of the fourth to sixth transparent display panels 204 to 206 is arranged to face the first to third transparent display panels 201 to 203, respectively, and the first bezel area BA1, where the pad electrode 158 (of FIG. 6) and the color filter pattern 124, in the fourth to sixth transparent display panels 204 to 206 is disposed at a fourth side, which is opposite to the third side.

Namely, the first to sixth transparent display panels 201 to 206 are arranged such that the second to fourth bezel areas BA2 to BA4, where the transparent dam 130 is presented without the pad electrode and the color filter pattern, are adjacent to each other, and the first bezel area BA1, where the pad electrode 158 and the color filter pattern 124 are presented, of the first to sixth transparent display panels 201 to 206 is disposed at two sides of the transparent display device 300, e.g., an upper side and a lower side. In other words, the first bezel area BA1, where the pad electrode 158 and the color filter pattern 124 are presented, is disposed at two edges of the transparent display device 300.

The color filter pattern 124 in the first to sixth transparent display panels 201 to 206 may have the same color or different colors. Namely, the color filter patterns 124 in the first to sixth transparent display panels 201 to 206 may be formed of the same material or different materials.

In FIG. 9, six transparent display panels 201 to 206 are arranged in a 3*2 matrix shape. Alternatively, at least one transparent display panel may be arranged in each of first and second rows along a first direction, and the bezel area, where the pad electrode 158 and the color filter pattern 124 are presented, of the transparent display panels in the first and second rows may be disposed at outer side in a second direction being perpendicular to the first direction. The number of the transparent display panel in each row is not limited.

In the transparent display device 300 according to the third aspect of the present disclosure, the difference in visibility between the display area and the bezel area and the ambient light reflection by the pad electrode are minimized or prevented, and the viewing problem of the boundaries between adjacent transparent display panels is prevented.

Figure 10:
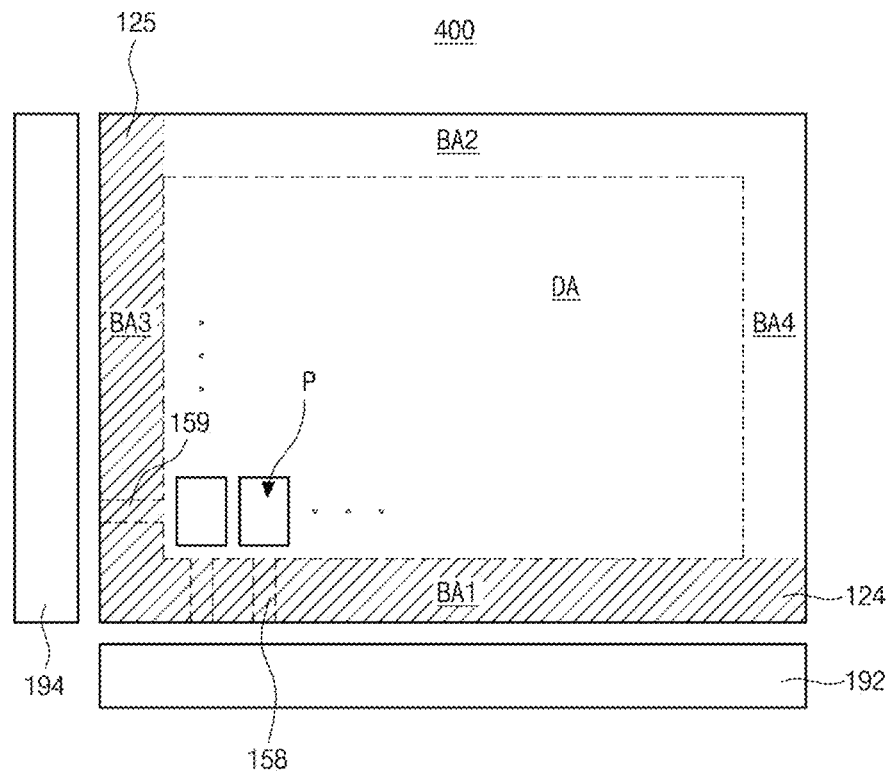
FIG. 10 is a schematic planar view of a transparent display device according to a fourth aspect of the present disclosure.

FIG. 10 is a schematic planar view of a transparent display device according to a fourth aspect of the present disclosure.

As shown in FIG. 10, a transparent display device 400 according to the fourth aspect of the present disclosure includes a display area DA including a plurality of pixel regions P, first to fourth bezel areas BA1, BA2, BA3 and BA4 surrounding the display area DA, first and second pad electrodes 158 and 159, which are respectively disposed in the first and third bezel areas BA1 and BA3 and electrically connected to the pixel region P, a transparent dam (not shown) in the first to fourth bezel areas BA1 to BA4, a first color filter pattern 124 in the first bezel area BA1, and a second color filter pattern 125 in the third bezel area BA3.

Each of the first and second pad electrodes 158 and 159 may be connected to an external driving part. For example, the first and second pad electrodes 158 and 159 may be connected to a data driver IC 192 and a gate driver IC 194, respectively.

In the transparent display device 400 according to the fourth aspect of the present disclosure, the transparent dam is disposed in all of the first to fourth bezel areas BA1 to BA4, while the color filter patterns 124 and 125 are disposed in the bezel areas, where the first and second pad electrodes 158 and 159 are formed. Namely, the color filter patterns 124 and 125 are disposed in the first and third bezel areas BA1 and BA3 and are not presented in the second and fourth bezel areas BA2 and BA4. In the second and fourth bezel areas BA2 and BA4, the transparent dam without the color filter pattern 124 and 125 and the pad electrode 158 and 159 is presented.

In other words, in adjacent two bezel areas, i.e., the first and third bezel areas BA1 and BA3, the first and second pad electrodes 158 and 159 are disposed on the first substrate 110 (of FIG. 7), and the first and second color filter patterns 124 and 125 are disposed on the second substrate 120 (of FIG. 7). In addition, the transparent dam 130 (of FIG. 7) is disposed between the first and second substrates 110 and 120. The transparent dam 130 is also disposed in the second and fourth bezel areas BA2 and BA4, while the pad electrode and the color filter pattern are not presented in the second and fourth bezel areas BA2 and BA4.

Since the transparent dam having high light transmittance is disposed in the second and fourth bezel areas BA2 and BA4, the second and fourth bezel areas BA2 and BA4 have similar or substantially the same optical property as the transparent portion of the display area DA. On the other hand, since the first and second color filter patterns 124 and 125 are respectively disposed in the first and third bezel areas BA1 and BA3, the ambient light reflection by the first and second pad electrodes 158 and 159 in the first and third bezel areas BA1 and BA3 is decreased. In addition, since the light passing through the first and second color filter patterns 124 and 125 is displayed in the first and third bezel areas BA1 and BA3, the difference in visibility between the display area DA and the bezel area BA is decreased.

Figure 11:
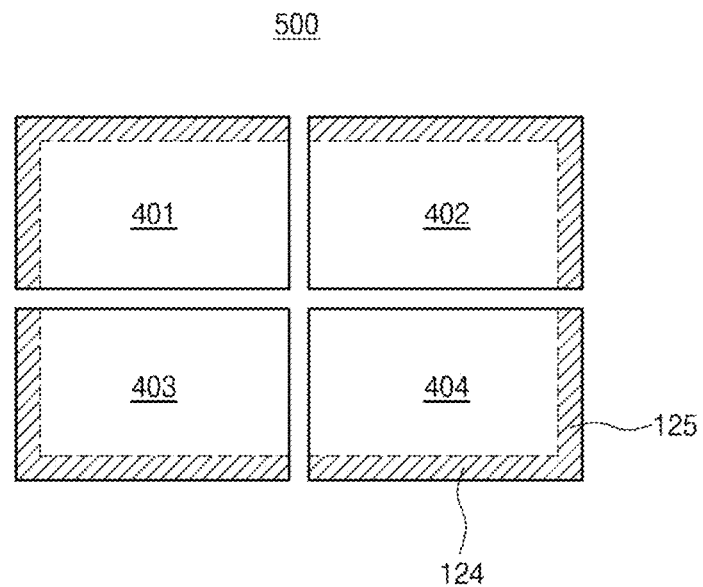
FIG. 11 is a schematic planar view of a transparent display device according to a fifth aspect of the present disclosure.

FIG. 11 is a schematic planar view of a transparent display device according to a fifth aspect of the present disclosure.

As shown in FIG. 11, a transparent display device 500 according to the fifth aspect of the present disclosure includes first and second transparent display panels 401 and 402 arranged along a first direction and third and fourth transparent display panels 403 and 404 arranged along the first direction and disposed at a second direction, which is perpendicular to the first direction, from the first and second transparent display panels 401 and 402. Namely, the first to fourth transparent display panels 401 to 404 are arranged in a 2*2 matrix shape.

Each of the first to fourth transparent display panels 401 to 404 may have a structure or configuration being substantially same as the transparent display device according to the fourth aspect of the present disclosure explained with FIG. 10.

Namely, referring to FIG. 10, each of the first to fourth transparent display panels 401 to 404 includes the display area DA and the first to fourth bezel areas BA1 to BA4 surrounding the display area DA. In the display area DA, a plurality of pixel regions P each including the emitting portion EA and the transparent portion TA are defined.

In adjacent two bezel areas, i.e., the first and third bezel areas BA1 and BA3, the first and second pad electrodes 158 and 159, which are electrically connected to the pixel region P, are disposed on the first substrate 110, and the first and second color filter patterns 124 and 125 are disposed on the second substrate 120. In addition, the transparent dam 130 is disposed between the first and second substrates 110 and 120. The transparent dam 130 is also disposed in the second and fourth bezel areas BA2 and BA4, while the pad electrode and the color filter pattern are not presented in the second and fourth bezel areas BA2 and BA4.

In the first to fourth transparent display panels 401 to 404 of the transparent display device 500, the second and fourth bezel areas BA2 and BA4 are arranged to be adjacent, and the first and third bezel areas BA1 and BA3 are disposed to surround edges of the transparent display device 500. In other words, the first and third bezel areas BA1 and BA3 of the first to fourth transparent display panels 401 to 404 form a rectangular frame shape, and the second and fourth bezel areas BA2 and BA4 of the first to fourth transparent display panels 401 to 404 are disposed in an inner space surrounded by the first and third bezel areas BA1 and BA3.

The first to fourth transparent display panels 401 to 404 are arranged such that the second and fourth bezel areas BA2 and BA4, where the transparent dam 130 is presented without the pad electrode and the color filter pattern, are adjacent to each other, and the first and third bezel areas BA1 and BA3, where the pad electrodes 158 and 159 and the color filter patterns 124 and 125 are presented, of the first to fourth transparent display panels 401 to 404 are disposed at edges of the transparent display device 500.

The first and second color filter patterns 124 and 125 in the first to fourth transparent display panels 401 to 404 may have the same color or different colors. Namely, the first and second color filter patterns 124 and 125 in the first to fourth transparent display panels 401 to 404 may be formed of the same material or different materials.

Although not shown, a transparent display panel, which includes the pad electrode and the color filter pattern in only the third bezel area, may be further arranged between the first and third transparent display panels 401 and 403 and between the second and fourth transparent display panels 402 and 404.

In the transparent display device 500 according to the fifth aspect of the present disclosure, the difference in visibility between the display area and the bezel area and the ambient light reflection by the pad electrode are minimized or prevented, and the viewing problem of the boundaries between adjacent transparent display panels is prevented.

Figure 12:
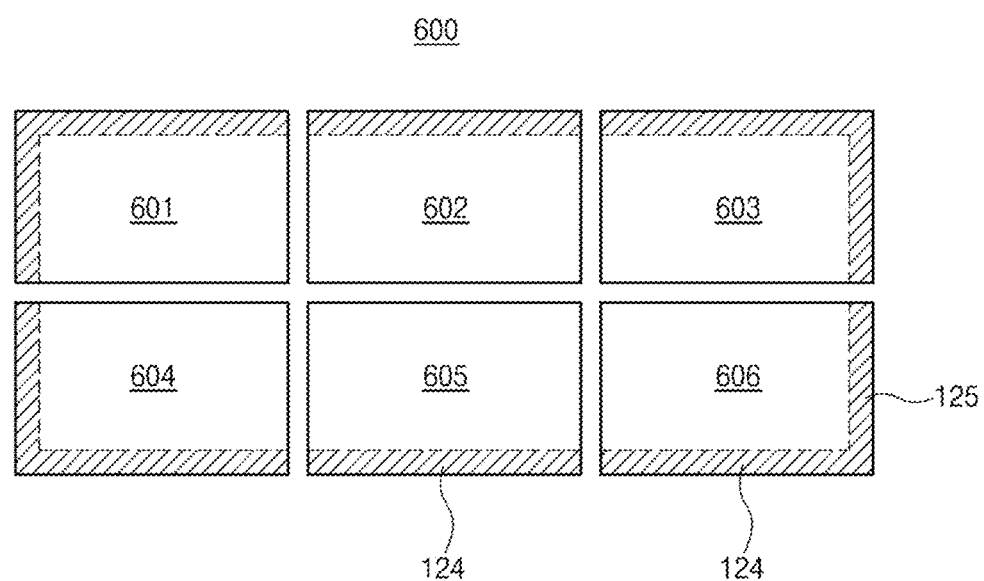
FIG. 12 is a schematic planar view of a transparent display device according to a sixth aspect of the present disclosure.

FIG. 12 is a schematic planar view of a transparent display device according to a sixth aspect of the present disclosure.

As shown in FIG. 12, a transparent display device 600 according to the sixth aspect of the present disclosure includes first to third transparent display panels 601, 602 and 603 arranged along a first direction and fourth to sixth transparent display panels 604, 605 and 606 arranged along the first direction and disposed at a second direction, which is perpendicular to the first direction, from the first to third transparent display panels 601 to 603. Namely, the first to sixth transparent display panels 601 to 606 are arranged in a 3*2 matrix shape.

Each of the second and fifth transparent display panels 602 and 605 may have a structure or configuration being substantially same as the transparent display device according to the second aspect of the present disclosure explained with FIGS. 6 to 8, and each of the first, third, fourth and sixth transparent display panels 601, 603, 604 and 606 may have a structure or configuration being substantially same as the transparent display device according to the fourth aspect of the present disclosure explained with FIG. 10

Referring to FIGS. 6 to 8, each of the second and fifth transparent display panels 602 and 605 includes the display area DA and the first to fourth bezel areas BA1 to BA4 surrounding the display area DA. In the display area DA, a plurality of pixel regions P each including the emitting portion EA and the transparent portion TA are defined. In the first bezel area BA1, the pad electrode 158, which is electrically connected to the pixel region P, is disposed on the first substrate 110, and the color filter pattern 124 is disposed on the second substrate 120. In addition, the transparent dam 130 is disposed between the first and second substrates 110 and 120. The transparent dam 130 is also disposed in the second to fourth bezel areas BA2 to BA4, while the pad electrode and the color filter pattern are not presented in the second to fourth bezel areas BA2 to BA4.

Referring to FIG. 10, each of the first, third, fourth and sixth transparent display panels 601, 603, 604 and 606 includes the display area DA and the first to fourth bezel areas BA1 to BA4 surrounding the display area DA. In the display area DA, a plurality of pixel regions P each including the emitting portion EA and the transparent portion TA are defined.

In adjacent two bezel areas, i.e., the first and third bezel areas BA1 and BA3, the first and second pad electrodes 158 and 159, which are electrically connected to the pixel region P, are disposed on the first substrate 110, and the first and second color filter patterns 124 and 125 are disposed on the second substrate 120. In addition, the transparent dam 130 is disposed between the first and second substrates 110 and 120. The transparent dam 130 is also disposed in the second and fourth bezel areas BA2 and BA4, while the pad electrode and the color filter pattern are not presented in the second and fourth bezel areas BA2 and BA4.

A first side of the second transparent display panel 602 is arranged to face the fifth transparent display panels 605, and the first bezel area BA1 (of FIG. 6), where the pad electrode 158 (of FIG. 6) and the color filter pattern 124 are disposed, in the second transparent display panel 602 is disposed at a second side, which is opposite to the first side.

A third side of the fifth transparent display panel 605 is arranged to face the second transparent display panels 602, and the first bezel area BA1, where the pad electrode 158 and the color filter pattern 124 are disposed, in the fifth transparent display panel 605 is disposed at a fourth side, which is opposite to the third side.

In the first, third, fourth and sixth transparent display panels 601, 603, 604 and 606 of the transparent display device 600, the second and fourth bezel areas BA2 and BA4 are arranged to face adjacent transparent display panels, and the first and third bezel areas BA1 and BA3 with the first bezel area BA1 of the second and fifth transparent display panel 602 and 605 are arranged to surround edges of the transparent display device 600. In other words, the first and third bezel areas BA1 and BA3 of the first, third, fourth and sixth transparent display panels 601, 603, 604 and 606 and the first bezel area BA1 of the second and fifth transparent display panel 602 and 605 form a rectangular frame shape, and the second and fourth bezel areas BA2 and BA4 of the first, third, fourth and sixth transparent display panels 601, 603, 604 and 606 and the second to fourth bezel areas BA2 to BA4 of the second and fifth transparent display panel 602 and 605 are disposed in an inner space surrounded by the first and third bezel areas BA1 and BA3 of the first, third, fourth and sixth transparent display panels 601, 603, 604 and 606 and the first bezel area BA1 of the second and fifth transparent display panel 602 and 605.

The first to sixth transparent display panels 601 to 606 are arranged such that the second and fourth bezel areas BA2 and BA4, where the transparent dam 130 is presented without the pad electrode and the color filter pattern, of the first, third, fourth and sixth transparent display panels 601, 603, 604 and 606 and the second to fourth bezel areas BA2 to BA4, where the transparent dam 130 is presented without the pad electrode and the color filter pattern, of the second and fifth transparent display panel 602 and 605 are adjacent to each other, and the first and third bezel areas BA1 and BA3, where the pad electrodes 158 and 159 and the color filter patterns 124 and 125 are presented, of the first, third, fourth and sixth transparent display panels 601, 603, 604 and 606 and the first bezel area BA1, where the pad electrode 158 and the color filter pattern 124 are presented, of the second and fifth transparent display panels 602 and 605 are disposed at edges of the transparent display device 600.

In each of the first, third, fourth and sixth transparent display panels 601, 603, 604 and 606, the first and second color filter patterns 124 and 125 may have the same color or different colors. Namely, the first and second color filter patterns 124 and 125 in each of the first, third, fourth and sixth transparent display panels 601, 603, 604 and 606 may be formed of the same material or different materials.

In addition, the color filter patterns 124 and 125 of the first to sixth transparent display panels 601 to 606 may have the same color or different colors. Namely, the first and second color filter patterns 124 and 125 in the first to sixth transparent display panels 601 to 606 may be formed of the same material or different materials.

In FIG. 12, one transparent display panel, i.e., the second transparent display panel 602, is disposed between the first and third transparent display panels 601 and 603, and one transparent display panel, i.e., the fifth transparent display panel 605, is disposed between the fourth and sixth transparent display panels 604 and 606. Alternatively, two or more second transparent display panels 602 may be disposed between the first and third transparent display panels 601 and 603, and two or more fifth transparent display panel 605 may be disposed between the fourth and sixth transparent display panels 604 and 606.

In addition, a transparent display panel, which includes the pad electrode and the color filter pattern in only the third bezel area, may be further arranged between the first and fourth transparent display panels 601 and 604 and between the third and sixth transparent display panels 603 and 606.

In the transparent display device 600 according to the sixth aspect of the present disclosure, the difference in visibility between the display area and the bezel area and the ambient light reflection by the pad electrode are minimized or prevented, and the viewing problem of the boundaries between adjacent transparent display panels is prevented.

It will be apparent to those skilled in the art that various modifications and variations may be made in the present disclosure without departing from the spirit or scope of the present disclosure. Thus, it is intended that the present disclosure cover the modifications and variations of this disclosure provided they come within the scope of the appended claims and their equivalents.

What is claimed is:

1. A display device, comprising:
    a first substrate and a second substrate facing each other, the first substrate comprising a display area and a bezel area surrounding the display area;
    a filler layer disposed between the first substrate and the second substrate;
    a color filter layer on the second substrate and in the display area;
    a dam disposed between the first substrate and the second substrate surrounding the filler layer; and
    a color filter pattern disposed at the bezel area of the second substrate and overlapping the dam,
    wherein the color filter pattern reduces ambient light reflection in the dam, and
    wherein the color filter pattern is spaced apart from the color filter layer in an outermost portion of the display area.

2. The display device according to claim 1, further comprising a light emitting diode disposed on the first substrate and covered with the filler layer.

3. The display device according to claim 2, wherein the color filter layer is disposed between the light emitting diode and the second substrate.

4. The display device according to claim 3, wherein the color filter pattern is formed of the same material as the color filter layer in a pixel region adjacent to dam.

5. The display device according to claim 2, further comprising an encapsulation layer under the filler layer and on the light emitting diode.

6. The display device according to claim 1, wherein the color filter layer is disposed between the first substrate and the second substrate and overlapping the filler layer.

7. The display device according to claim 1, wherein the dam includes a polymer resin, a getter and a spacer, and
    wherein the getter includes magnesium oxide (MgO) or zirconium oxide (ZrO).

8. The display device according to claim 1, wherein the filler layer includes a transparent resin having a moisture-absorption property.

9. The display device according to claim 1, wherein the second substrate includes first to fourth sides.

10. The display device according to claim 9, wherein the color filter pattern is presented to correspond to adjacent two of the first to fourth sides.

11. The display device according to claim 9, wherein the color filter pattern is presented to correspond to opposite two of the first to fourth sides.

12. A display device, comprising:
- a first substrate and a second substrate facing each other, the first substrate comprising a display area and a bezel area surrounding the display area;
- a filler layer disposed between the first substrate and the second substrate;
- a light emitting diode disposed on the first substrate and covered with the filler layer;
- a dam disposed between the first substrate and the second substrate surrounding the filler layer;
- a pad electrode disposed on the first substrate; and
- a color filter pattern disposed on the second substrate and overlapping the dam,
- wherein the bezel area includes a first bezel area and a second bezel area,
- wherein the second bezel area is adjacent to the first bezel area or opposite to the first bezel area,
- wherein the pad electrode and the color filter pattern face each other at the first bezel area, and
- wherein the pad electrode and the color filter pattern are not presented in the second bezel area.

13. The display device according to claim 12, further comprising a color filter layer disposed on the second substrate and in the display area.

14. The display device according to claim 13, wherein the color filter pattern is formed of a same material as the color filter layer.

15. The display device according to claim 12, further comprising an encapsulation layer disposed under the filler layer.

16. The display device according to claim 12, further comprising a color filter layer disposed between the first substrate and the second substrate and overlapping the filler layer.

17. The display device according to claim 12, wherein the dam includes a polymer resin, a getter and a spacer, and
wherein the getter includes magnesium oxide (MgO) or zirconium oxide (ZrO).

18. The display device according to claim 12, wherein the filler layer includes a transparent resin having a moisture-absorption property.

19. The display device according to claim 12, wherein the second substrate includes first to fourth sides.

20. The display device according to claim 19, wherein the color filter pattern is disposed corresponding to adjacent two of the first to fourth sides.

21. The display device according to claim 12, wherein an end of the dam in the first bezel area contacts the color filter pattern, and an entire surface of an end of the dam in the second bezel area contacts the second substrate.

* * * * *